United States Patent
Yang

(10) Patent No.: US 8,138,937 B2
(45) Date of Patent: Mar. 20, 2012

(54) GROUNDING MONITORING DEVICE AND SYSTEM FOR WORK

(76) Inventor: Hsin-Ming Yang, Taipei (TW)

( * ) Notice: Subject to any disclaimer, the term of this patent is extended or adjusted under 35 U.S.C. 154(b) by 437 days.

(21) Appl. No.: 12/465,631

(22) Filed: May 13, 2009

(65) Prior Publication Data

US 2009/0251327 A1  Oct. 8, 2009

Related U.S. Application Data

(63) Continuation-in-part of application No. 11/964,151, filed on Dec. 26, 2007, now abandoned.

(51) Int. Cl.
| | |
|---|---|
| *G08B 21/00* | (2006.01) |
| *H02H 1/00* | (2006.01) |
| *H02H 1/04* | (2006.01) |
| *H02H 3/22* | (2006.01) |
| *H05F 3/00* | (2006.01) |
| *H05F 3/02* | (2006.01) |
| *H01H 47/00* | (2006.01) |

(52) U.S. Cl. .......... 340/649; 361/212; 361/220
(58) Field of Classification Search .......... 340/649; 361/212, 220

See application file for complete search history.

(56) References Cited

U.S. PATENT DOCUMENTS

| | | | | |
|---|---|---|---|---|
| 4,639,825 | A * | 1/1987 | Breidegam | 361/212 |
| 4,710,751 | A * | 12/1987 | Webster | 340/522 |
| 4,745,517 | A * | 5/1988 | Pitts | 361/212 |
| 5,057,965 | A * | 10/1991 | Wilson | 361/212 |
| 5,408,186 | A * | 4/1995 | Bakhoum | 324/509 |
| 5,422,630 | A * | 6/1995 | Quinn et al. | 340/661 |
| 5,519,384 | A * | 5/1996 | Chanudet et al. | 340/649 |
| 5,748,083 | A * | 5/1998 | Rietkerk | 340/568.2 |
| 5,909,181 | A * | 6/1999 | Golzmane | 340/649 |
| 6,052,053 | A * | 4/2000 | Jubin et al. | 340/540 |
| 7,085,120 | B2 * | 8/2006 | Kraz et al. | 361/220 |

* cited by examiner

*Primary Examiner* — Jennifer Mehmood
*Assistant Examiner* — Andrew Bee

(57) ABSTRACT

The present invention provides a device to monitor whether a work station operator has properly worn a grounding mechanism, and a novel cascading means to chain multiple devices into a chain for sharing electricity and ground. The present invention could achieve the following functions: (1) capable of monitoring both single-wire and two-wire grounding mechanisms; (2) providing backup grounding through the chain so that the static electricity discharging capability is maintained as long as a single device in the chain remains connected to the ground; (3) extending the ground through the chain so that grounding is not required to be previously prepared at every work station; (4) sustaining all devices on the chain by a single external power supply; and (5) providing networking connectivity through the chain's cascading cables so that the network cabling cost and effort is significantly reduced.

23 Claims, 15 Drawing Sheets

GROUNDING MONITORING DEVICE AND SYSTEM FOR WORK

CROSS REFERENCE

This is a continuation-in-part of U.S. patent application Ser. No. 11/964,151, filed on Dec. 26, 2007 now abandoned, which is incorporated herewith by reference.

BACKGROUND OF THE INVENTION

1. Field of the Invention

The present invention generally relates to monitoring electrical grounding, and more particularly to a device and system that automatically monitors an operator's grounding mechanisms only when the operator is actually present in front of a work station.

2. The Related Art

How to prevent electro-static discharge (ESD) from damaging valuable equipment or causing critical fabrication process to fail is still an important issue in high-tech industries. It is well known that proper grounding is the essential solution. However, despite the advancement of technology, ensuring such a proper grounding is not as easy as most people imagine.

A typical manufacturing environment usually contains a number of assembly lines, and each assembly line usually contains a number of work stations, each for a specific assembly task or manufacturing operation. To prevent ESD from damaging the parts, devices, or the semi-products being assembled, the operator at the work station is usually required to wear an anti-static wrist strap, the floor is usually paved with an anti-static floor mat, and the table top of the work station is usually covered with an anti-static table mat. As illustrated in FIG. 1a, the floor mat 10, table mat 20, and the wrist strap 30 are usually electrically connected to a common-point ground 40 of the work station by grounding cables, respectively (for simplicity, the drawing only shows a ground cable connecting the wrist strap 30 and the common-point ground 40). The common-point ground 40 is usually a metallic plate fixedly positioned at some place of the work station with a plastic cover for protection. The common-point grounds of an assembly line's work stations are series- or parallel-connected together, which are in turn connected to an equipment ground or an earth ground of the manufacturing facility (again, for simplicity, the equipment and earth grounds are not shown in the drawing). As such, the static electricity carried by or accumulated on an operator sitting or standing in front of the work station is discharged to the earth through the wrist strap, table mat, or the floor mat, via the common-point ground of the work station and then the equipment or earth ground of the manufacturing facility, thereby preventing potential hazards from ESD.

The aforementioned grounding system is a proven solution and has been widely adopted for years. However, it suffers a number of disadvantages. First, this grounding system works only if the wrist strap, the floor mat, and the table mat are properly connected to the common-point ground. However, the grounding cables therebetween could be rusted or broken, or the grounding cables could be disconnected from the common-point ground due to the movement of the operator. In addition, when the operator has to take a break or to go for lunch, he or she may take down the wrist strap and leave it on the work station. Or, in most of the existing implementations, the grounding cable of the wrist strap has a plug at one end so as to plug into a socket of the common-point ground. Therefore, the operator unplugs the grounding cable (but still wears the wrist strap) before going for a break or lunch. When the operator returns, he or she then put the wrist strap back or plug the grounding cable again. As can be imagined, a lazy operator may avoid wearing the wrist strap; or an absent-minded operator may forget to put back or re-plug the wrist strap after returning to his or her post. The static electricity carried by or accumulated on the operator cannot be discharged to the ground, and may very possible damage the valuable equipment or parts or semi-product or completed product at the work station.

As such, the present inventor has disclosed a wireless monitoring device for a work station operator to see if the operator has properly worn a wrist strap or similar grounding mechanism (U.S. patent application Ser. No. 11/964,151 filed on Dec. 26, 2007, hereinafter, the previous application). The representative drawing of the previous application is attached as FIG. 1b. As illustrated, the monitoring device 100 mainly contains a microprocessor circuit 200 as its core. The device 100 is connected to the mains via a power cable or via an external power supply (e.g., a power adaptor such as those used by a notebook computer). The connection to the mains is very important in that, on one hand, the electricity extracted from the mains is processed by a power unit 500 of the device 100 to provide appropriate direct-current (DC) voltages to the microprocessor circuit 200. On the other hand, the ground 60 of the mains is thereby electrically introduced into the device 100. The device 100 is also connected to the manufacturing facility's equipment ground or earth ground 50 (hereinafter, jointly referred to as earth ground) via an interface 120. This can be achieved by connecting a common-point ground 40 of the work station or, as illustrated, by directly connecting the earth ground 50. Additionally, the device 100 is connected to two conducting wires 31, 32 of a wrist strap 30 via another interface 110. As illustrated, an end of the wire 31 is electrically connected to the earth ground 50 inside the device 100 whereas an end of the wire 32 is electrically connected to the mains ground 60 via the microprocessor circuit 200. The other ends of the wires 31, 32 are connected to two conducting plates embedded in an insulating casing of the wrist strap 30, respectively. The conducting plates 33 are usually exposed from the inside of the insulating casing so as to contact an operator's wrist skin 70. As such, when the operator has properly worn the wrist strap 30, a discharge circuit, shown by the dashed lines of FIG. 1b, is established from the mains ground 60, through the earth, the earth ground 50, the wire 31, the skin 70, the wire 32, and then to the mains ground 60 via the microprocessor circuit 200. A major function of the microprocessor circuit 200 is in determining if the discharge circuit has an appropriate resistance. The rest of the details could be found in the previous application and is omitted here.

There are still some disadvantages for the monitoring device 100 taught by the previous application. First of all, the monitoring device 100 is applicable to grounding mechanism with two conducting wires, yet there are quite some commercially available single-wire grounding mechanisms. The monitoring device 100 is therefore not applicable to these single-wire grounding mechanisms. Secondly, the monitoring device 100 could only monitor the grounding mechanisms an operator is equipped with but cannot provide additional ESD protection to the operator. For example, if the connection between the common point ground 40 and the earth ground 50 is somehow disconnected (e.g., at a place marked by X in FIG. 1b), the monitoring device 100 would signal an alarm and the operator has to stop his or her work until the disconnection is fixed. But, as can be seen in FIG. 1b, the mains ground 60 connected to the monitoring device 100 could provide the required grounding and the operator actually does not need to stop his or her work. In other words, the monitoring device 100 could actually provide the mains ground 60 as an auxiliary grounding for additional ESD protection. Additionally, according to the previous application, every monitoring device 100 would require a power cable or a power adaptor, and an outlet for plugging the power cable or the power adaptor, which would increase the product and installation costs.

SUMMARY OF THE INVENTION

Accordingly, the present invention provides a device to monitor whether a work station operator has properly worn a wrist strap or similar grounding mechanism, and a system cascading these devices, so as to obviate the aforementioned shortcomings of the prior arts.

A major characteristic of the device is that a wireless energy (e.g., infrared) transmission and detection mechanism is incorporated to sense if the operator is present in front of the work station. The device monitors the resistance of a loop composed of the operator's wrist strap. If the monitored resistance is not in a proper range, for example, when the wrist strap is not worn or the 1-MΩ resistor in the grounding cable is broken or shorted, the device will automatically issue alarms, only if the wireless energy transmission and detection mechanism has sensed that the operator is indeed present at the work station.

Compared with the previous application, the present invention further provides a novel electrical connection within the device and a novel cascading means to chain multiple devices together for sharing electricity and ground. The present invention could further achieve the following functions: (1) capable of monitoring both single-wire and two-wire grounding mechanisms; (2) providing backup grounding through the chain so that the static electricity discharging capability is maintained as long as a single device in the chain remains connected to the ground; (3) extending the ground through the chain so that grounding is not required to be previously prepared at every work station; (4) sustaining all devices on the chain by a single external power supply; and (5) providing networking connectivity through the chain's cascading cables so that the network cabling cost and effort is significantly reduced.

The foregoing and other objects, features, aspects and advantages of the present invention will become better understood from a careful reading of a detailed description provided herein below with appropriate reference to the accompanying drawings.

DETAILED DESCRIPTION OF THE PREFERRED EMBODIMENT

The following descriptions are exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Figure 1A:
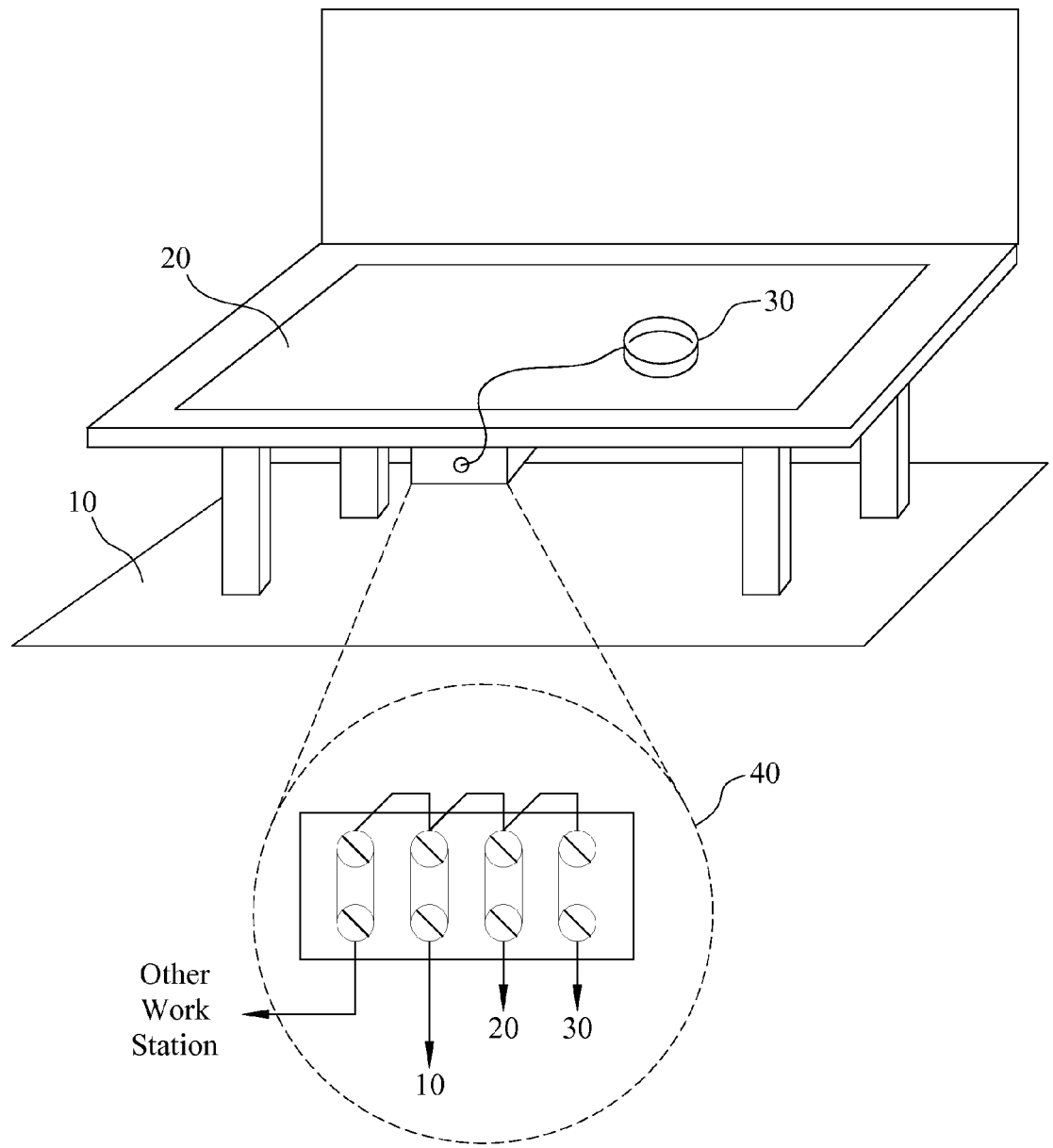
FIG. 1a is a schematic diagram showing a conventional grounding structure commonly found on a work station.
Figure 1B:
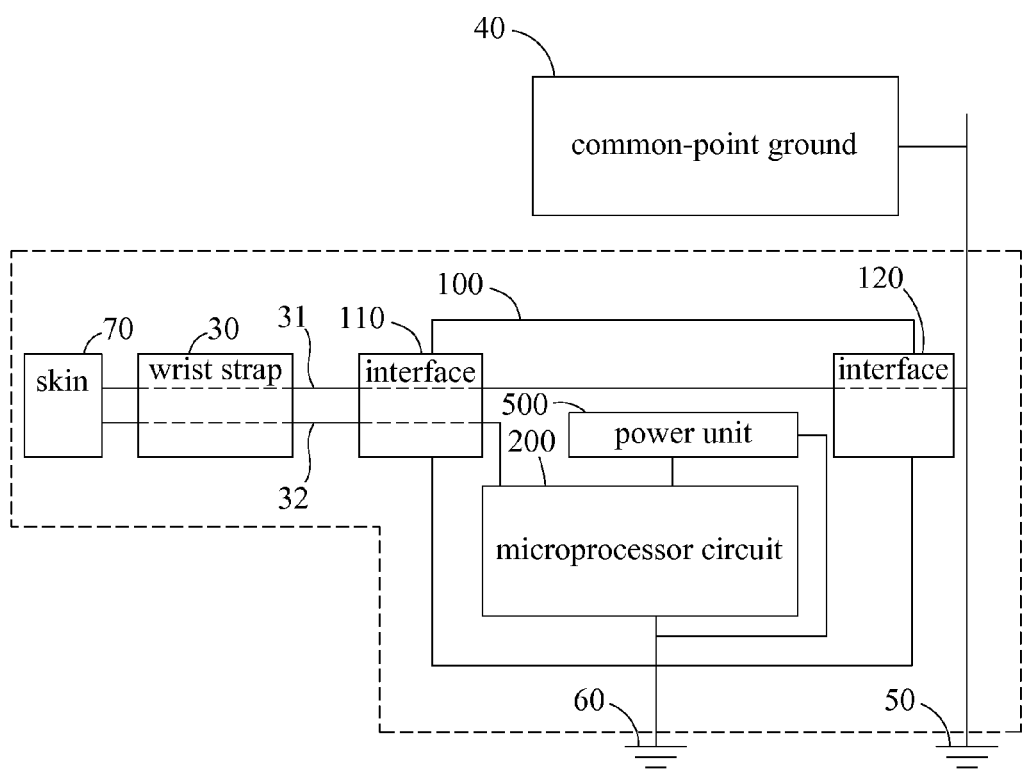
FIG. 1b is a representative drawing of U.S. patent application Ser. No. 11/964,151.
Figure 2A:
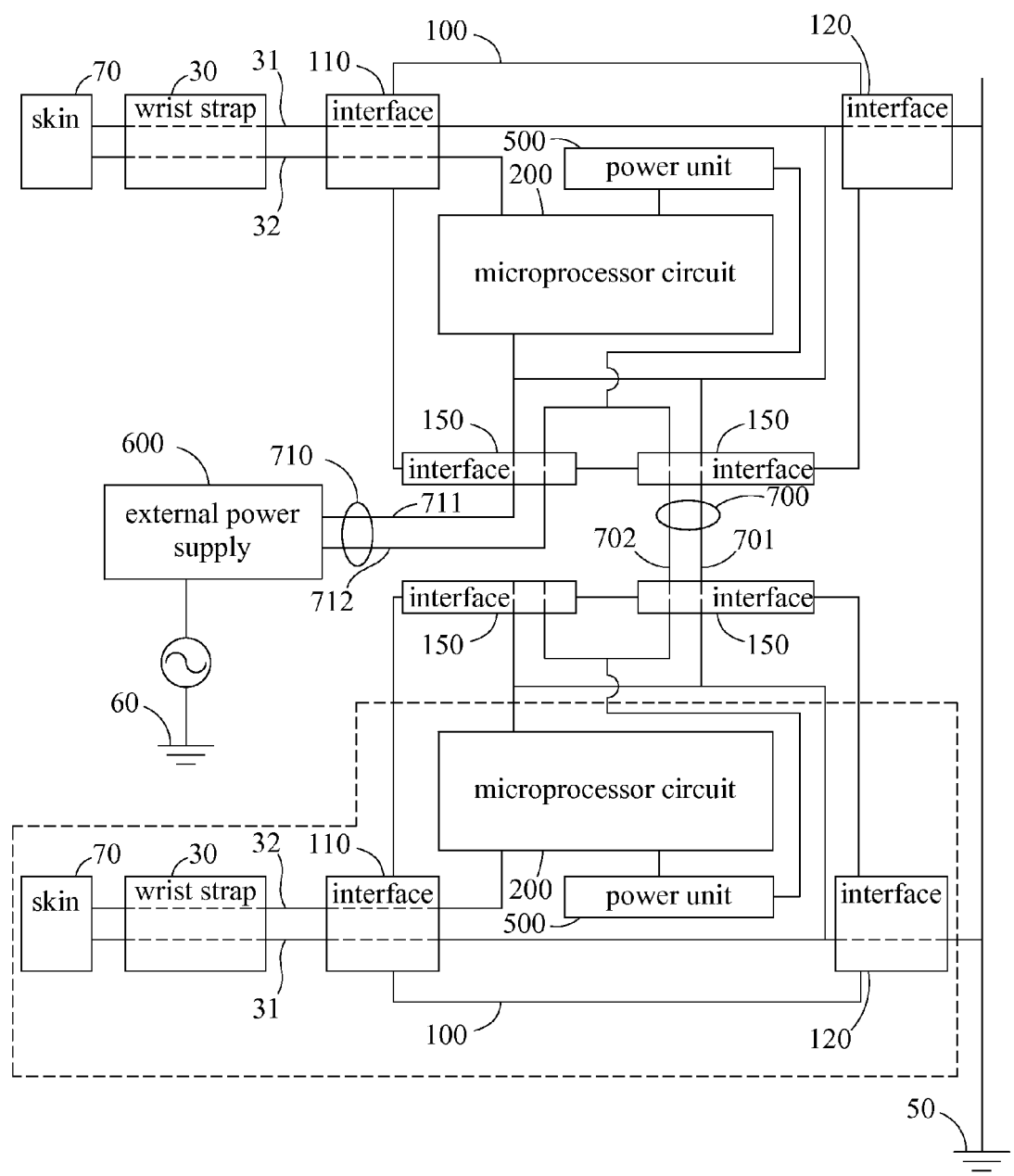
FIG. 2a is a schematic diagram showing two monitoring devices according to a first embodiment of the present invention are connected into a monitoring system.

FIG. 2a is a schematic diagram showing two monitoring devices are connected into a monitoring system according to a first embodiment of the present invention. As illustrated, the two monitoring devices 100 are series-connected by a cable 700 containing at least two conducting wires 701 and 702 through their respective interfaces 150. One of the monitoring device 100 (i.e., the upper one in FIG. 2a) is further connected to an external power supply 600 by a cable 710 containing at least two conducting wires 711 and 712 through another interface 150. Similar to the previous application, the monitoring device 100 is a stand-alone device and mainly contains a microprocessor circuit 200 as its core. However, by comparing FIGS. 1b and 2a, it should be easy to see the difference between the monitoring devices of the present invention and the previous application.

Please note that, even though not explicitly shown in FIG. 1b, the monitoring device of the previous application also has an interface 150 connected to an external power supply 600, just like the present invention. However, they are omitted in FIG. 1b for simplicity and, in the present invention, they are explicitly illustrated. Compared to the monitoring device of the previous application, the monitoring device 100 of the present invention has an additional interface 150 for connecting another monitoring device 100 by the cable 700. In other words, the monitoring device 100 of the present invention has two interfaces 150 and the two interfaces 150 are actually completely identical. There is no requirement which one of them is for connecting the other monitoring device 100 and which one is for connecting the external power supply 600. The two interfaces 150 are interchangeable. Please note that, as shown in FIG. 2a, each interface 150 has at least two terminals (not shown): a first terminal and a second terminal. The first terminals of the two interfaces 150 are connected together, and the second terminals of the two interfaces 150 are connected together, both inside the monitoring device 100. However, the second terminals that are connected to either the wire 702 (in a cable 700) or the wire 712 (in a cable 710) are further connected to the power unit 500 of the monitoring device 100. On the other hand, the first terminals that are connected to either the wire 701 (in a cable 700) or the wire 711 (in a cable 710) are further connected to the microprocessor circuit 200 and the interface 120 of the monitoring device 100.

The external power supply 600 on one hand is connected to the mains and, on the other hand, is connected to a monitoring device 100 by a cable 710. As such, the external power supply 600 draws alternate-current (AC) electricity from the mains and supplies appropriate DC or AC voltage to the directly connected monitoring device 100 via the wire 712 of the cable 710. The mains ground 60 is also provided to the directly-connected monitoring device 100 by the external power supply 600 via the wire 711 of the cable 710. As shown in FIG. 2a, the DC or AC voltage is fed to the power unit 500 which in turn provides appropriate DC voltage to drive the microprocessor circuit 200. In the mean time, the mains ground 60 is also provided to the microprocessor circuit 200 and the interfaces 110 and 120. Additionally, the voltage and mains ground 60 from the external power supply 600 is passed to a next monitoring device 100 via the wires 702 and 701 of a cable 700, respectively. Even though only two monitoring devices 100 are illustrated in FIG. 2a, more monitoring devices 100 could be cascaded in a chain by using cables 700 to connect the interfaces 150 of any two neighboring monitoring devices 100. In this manner, the voltage and mains ground 60 from the external power supply 600 could be passed to every monitoring device 100 on the chain and a single external power supply 600 is shared by these monitoring devices 100. The present invention therefore is more cost-effective compared to the previous application which requires an external power supply 600 for every monitoring device. Please note that the monitoring device 100 is not required to be used always with another monitoring device 100. A monitoring device 100 could be used individually as long as it is connected to an external power supply 600 by a cable 710 by itself.

As shown in FIG. 1b, the previous application forms a closed loop (as denoted by the dashed lines) via the earth to determine if the wrist strap 30 is properly worn by an operator. In contrast, as shown in FIG. 2a, the present application closes the loop (as denoted by the dashed lines) within the monitoring device 100 itself. As illustrated, the loop consists of the connection between the interfaces 120 and 110, the wire 31, the operator's skin 70, the wire 32, the microprocessor circuit 200, and the connection between the microprocessor circuit 200 and the interface 200. One of the major functions of the microprocessor circuit 200 is to determine whether the loop has an appropriate resistance. In other words, the microprocessor circuit 200 measures the resistance between the wires 31 and 32 to see whether the wrist strap 30 is properly installed by the operator.

When a monitoring device 100 of the present invention is used individually (for example, considering only the upper monitoring device 100 of FIG. 2a), the charges carried or accumulated on the operator could be discharged to (1) the earth ground 50 through to its interface 120; and (2) the mains ground 60 through the cable 710. Therefore, when the monitoring device 100 and the earth ground 50 is for some reason disconnected, the charges carried or accumulated on the operator could still be discharged to the mains ground 60. In other words, the present invention provides the mains ground 60 as an auxiliary grounding, for an additional level of protection.

When a monitoring device 100 of the present invention is used in cascade (for example, using the lower monitoring device 100 of FIG. 2a as example), the charges carried or accumulated on the operator could be discharged to (1) the earth ground 50 through to its interface 120; (2) the earth ground 50 connected to another monitoring device 100 series-connected by one or more cables 700; and (3) the mains ground 60 through the external power supply 600 connected to another monitoring device 100 series-connected by one or more cables 710. Therefore, when the monitoring device 100 and the earth ground 50 is for some reason disconnected, the charges carried or accumulated on the operator could still be discharged. In other words, the present invention provides highly redundant grounding, for a significant level of protection. Assuming that there are N monitoring devices 100 cascaded together as described, each monitoring device 100 on the chain in effect has N+1 possible discharge paths. As long as one of the paths is functioning, the discharge capability of every monitoring device 100 on the chain is still preserved. Even when all monitoring devices 100 are disconnected from the earth ground 50, they could still discharge to the mains ground 60. This high level of redundancy is made possible by the cables 700 and the cable 710. If one of the cables 700 or the cable 710 is disconnected, since they are also responsible for the delivery of electricity, this will lead to one or more monitoring devices 100 stop functioning due to the lost of power. This should immediately get the attention of the operators and remedies could be adopted right away.

From the above description, it should be clear that there are various possible applications of the present invention. For example, only one monitoring device 100 on the chain is connected to the earth ground 50 and this is in effect a way to extend the earth ground 50 via the cascading monitoring devices 100, instead of requiring the availability of the earth ground 50 at every work station. If each monitoring device 100 has an additional interface, this extended earth ground 50 could actually be shared to other devices through the additional interface. In other words, each monitoring device 100 could actually function as a common-point ground 40 at each work station (therefore, there is no need to install common-point ground 40 at every work station). Another example is not to use the earth ground 50 at all and to simply rely on the mains ground 60. This would prove to be especially convenient when the earth ground 50 is not available.

Identical to the previous application, the interface 110 between the grounding cable of the wrist strap 30 and the device 100 could be one that supports dynamically plugging and unplugging. For example, the wrist strap 30 has a plug at an end and the device 100 has a compatible socket. In alternative embodiments, the interface 110 could provide fixed connection only. Similarly, the interface 120 to the earth ground 50 could provide either fixed or dynamic connection.

Figure 2B:
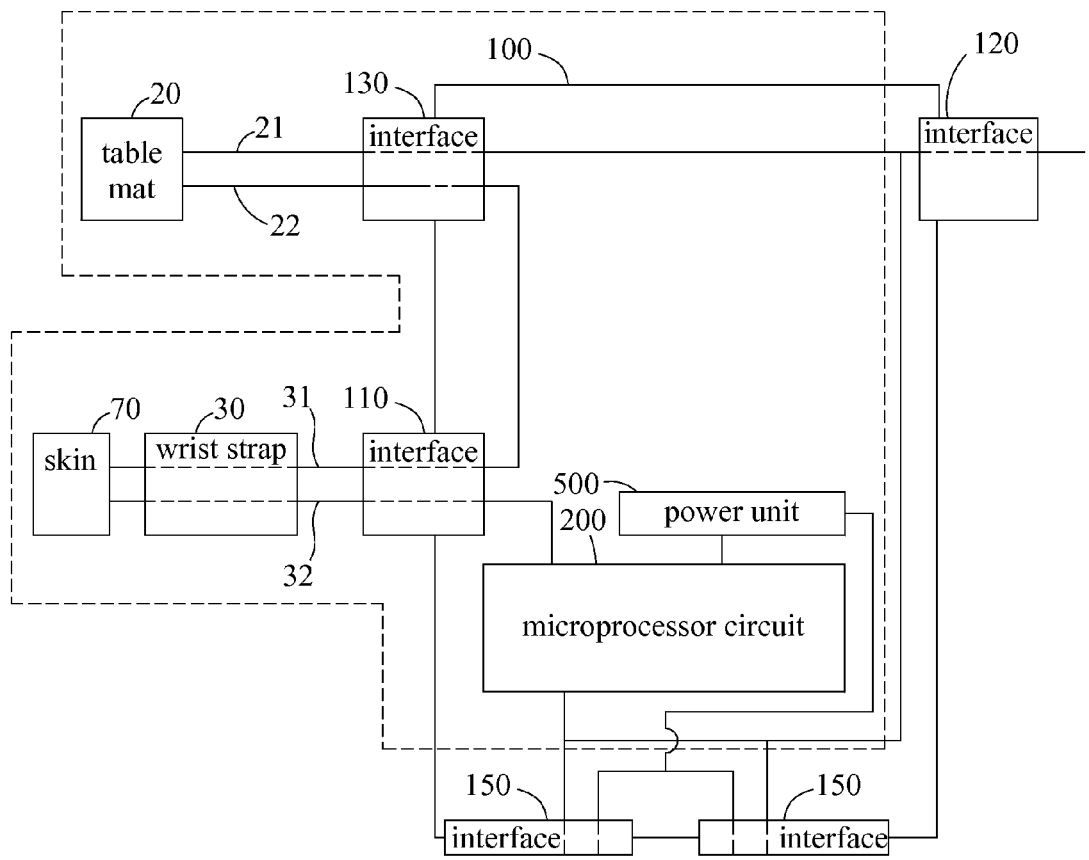
FIG. 2b is a schematic diagram showing a monitoring device according to a second embodiment of the present invention which monitors an additional series-connected grounding mechanism.

The present embodiment only monitors the wrist strap 30. FIG. 2b is a schematic diagram showing a monitoring device according to a second embodiment of the present invention which also monitors an additional grounding mechanism (such as a floor mat or a table mat). As illustrated, two wires 21, 22 of, for example, a table mat 20 are electrically connected to the earth ground 50 and the wrist strap 30, respectively, via an interface 130. Again, the interface 130 could provide fixed or dynamic connection. As illustrated, a loop, expressed by the dashed lines, is formed with the wrist strap 30 and the table mat 20 being series-connected, and the microprocessor circuit 200 is therefore able to monitor the table mat 20 and the wrist strap 30 simultaneously. In other words, in addition to the wrist strap 30, the monitoring device 100 is able to incorporate the monitoring of at least one of any two-wire grounding mechanisms together.

Figure 2C:
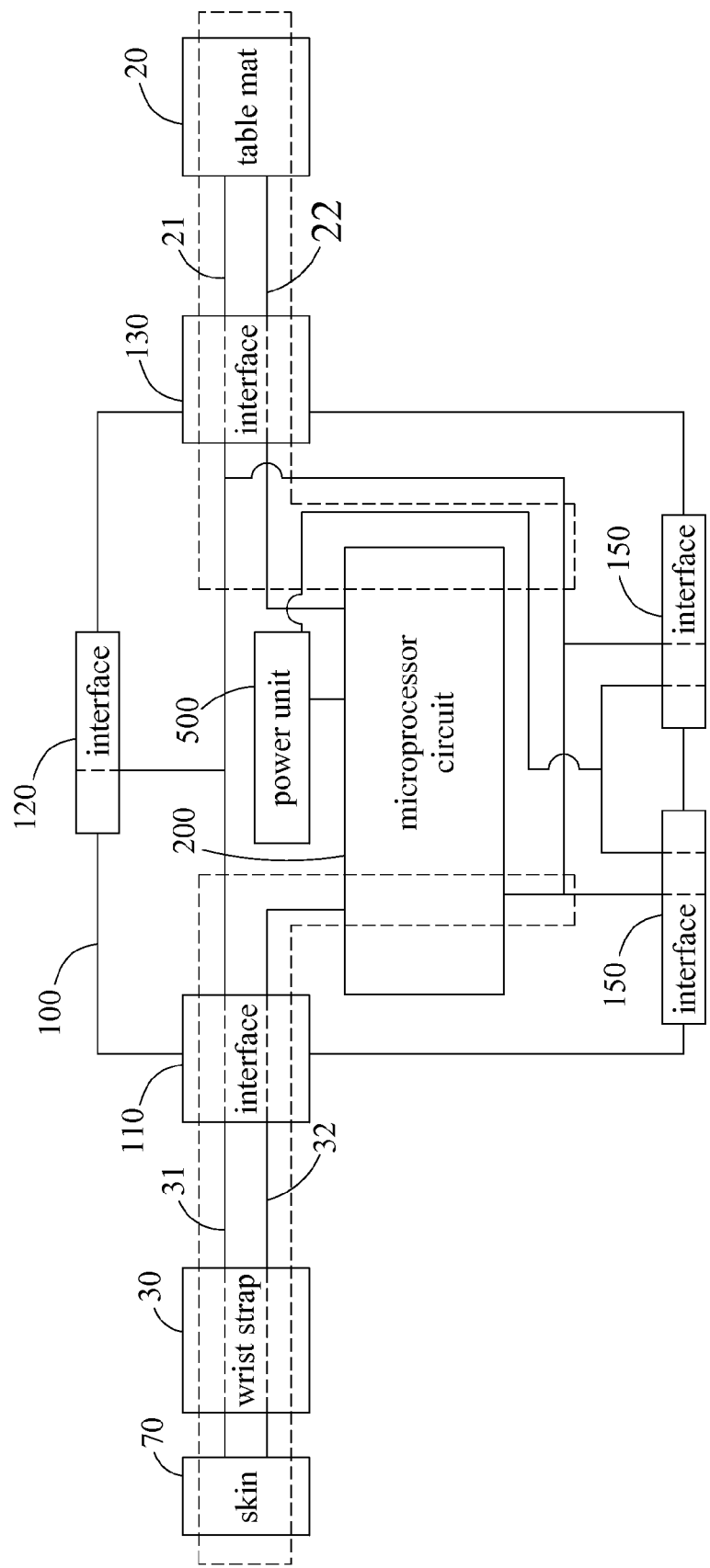
FIG. 2c is a schematic diagram showing a monitoring device according to a third embodiment of the present invention which monitors an additional parallel-connected grounding mechanism.

The microprocessor circuit 200 determines if the loop is normal by measuring the resistance of the loop. However, if there is indeed something wrong with the loop, the present embodiment is not able to tell which grounding mechanism is causing the problem. FIG. 2c is a schematic diagram showing a grounding monitoring device according to a third embodiment of the present invention. As illustrated, separate loops (shown by the dashed lines) are formed through the wrist strap 30 and the table mat 20 respectively. As such, the microprocessor circuit 200 is able to monitor the wrist strap 30 and the table mat 20 individually and simultaneously. Again, a person with ordinary skill can easily extend the same idea to incorporate the monitoring of the floor mat 10 and therefore the detail is omitted here. Please note that the microprocessor circuit 200 of FIG. 2b is not identical to the microprocessor circuit 200 of FIG. 2c, as additional parts are required in the parallel configuration of FIG. 2c to measure an additional loop. Again, a person of ordinary skill could easily extend the microprocessor circuit of series configuration to cover the microprocessor circuit of parallel configuration. Following the same line of thought, the present invention could be further extended to cover: (1) the monitoring of other grounding mechanisms similar to the wrist strap, the table mat, or the floor mat, as long as they also use two-wire grounding cables; (2) configurations where some grounding mechanisms are parallel-connected and some are series-connected; and (3) configurations with more than one wrist strap, table mat, or floor mat. For simplicity, the present specification will focus on the microprocessor circuit 200 of series configurations (e.g., FIG. 2b) and use only the wrist strap 30 as example to explain the details of the device 100.

Figure 3A:
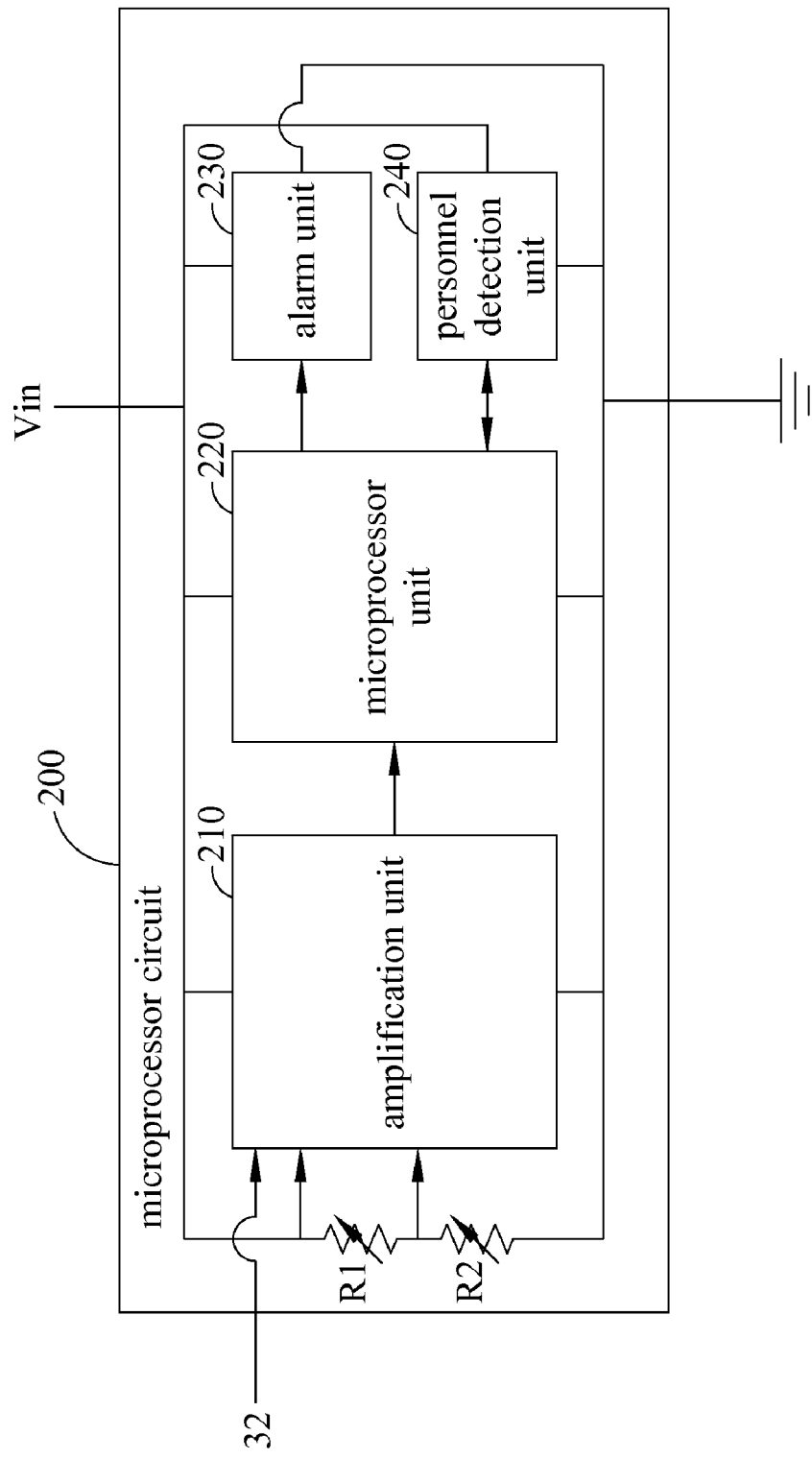
FIG. 3a is a functional block diagram showing a monitoring device's microprocessor circuit according to an embodiment of the present invention.

FIG. 3a is a functional block diagram showing a grounding monitoring device's microprocessor circuit according to an embodiment of the present invention. In the drawing, Vin is a DC voltage produced by the power unit 500 after drawing electricity from the mains to drive the microprocessor circuit 200.

As illustrated, the microprocessor circuit 200 contains a comparison and amplification unit 210 which is mainly composed of at least an operation amplifier. The variable resistors R1 and R2 are actually an integral part of the comparison and amplification unit 210 but they are separately shown for easier explanation. The provision of the series-connected R1 and R2 allows the operation amplifier(s) in the comparison and amplification unit 210 to see if the resistance of the loop introduced by the wire 32 has a value between R2 and R1. In other words, the function of the comparison and amplification unit 210 is to test if the resistance of the loop is bounded by a smaller first resistance (e.g., R2) and a larger second resistance (e.g., R1). If the operator does not put on the wrist strap 30, or the ground cable of the wrist strap 30 is rusted or broken, the resistance of the loop would be greater than the second (i.e., larger) resistance. On the other hand, if the operator has properly worn the wrist strap 30 and the grounding cable and everything else is normal, the resistance shouldn't be less than the first (i.e., smaller) resistance either. Therefore, if the resistance of the discharge circuit is greater than the second resistance or less than the first resistance, the comparison and amplification unit 210 would trigger a microprocessor unit 220. In alternative embodiments, it is possible to have only a single variable resistor R1 (i.e., omitting the variable resistor R2). These embodiments therefore will only detect if the resistance of the discharge circuit is greater than a specific value (i.e., the resistance of the variable resistor R1). There are also embodiments where the first and second resistances are implemented by fixed resistors. The advantage of having variable resistors is that, depending on whether the loop covers only the wrist strap, or has additional grounding mechanism such as table mat series-connected, the first and second resistances can be dynamically adjusted to reflect these variations. The adjustment of the variable resistors R1 and R2 can be conducted by manually twisting knobs or by a control panel, both on the device 100's casing. More details will be given later.

The microprocessor unit 220 is the core of the device 100. It could be a microcontroller unit (MCU), a single chip containing a processor, RAM, ROM, clock, and I/O control units. Millions of MCUs are in used in various devices ranging from automobiles to laser printers. The present specification therefore will not go into details.

After being triggered by the comparison and amplification unit 210, the microprocessor unit 220 activates an alarm unit 230 to issue alarms so as to remind the operator to wear the wrist strap or to get the attention of supervisors or managers. The alarm unit 230 contains one or more lamps, for example, made of light emitting diodes (LEDs). The alarm unit 230 turns on or flashes these lamps to provide visual alarms. The alarm unit could also contain one or more speakers or buzzers to provide audio alarms. These audio or visual alarms could be implemented individually or together. The alarm unit 230 could further contain electronic or mechanical relays to trigger additional devices. When the abnormality detected by the comparison and amplification unit 210 is resolved, the microprocessor unit 220 is notified to turn off the alarm unit 230. In alternative embodiments, there are reset buttons on the casing or control panel of the device 100 to shutdown the audio or visual alarms.

A personnel detection unit 240 is provided to see if there is indeed an operator present in front of the device 100 (i.e., in front of the work station). The personnel detection unit 240 may provide a presence signal when an operator appears or is present and an absence signal when the operator leaves or is absent. The presence and absence signals are delivered to the microprocessor unit 220 as well. As such, the microprocessor unit 220 is able to engage the detection of the loop's resistance and to trigger the alarm unit 230 if required, only when a operator is present in front of the device 100 (e.g., the microprocessor unit 220 has received. a presence signal but not an absence signal yet). When the operator has to leave the work station and take off the wrist strap 30 or disconnect the wrist strap 30 from the interface 110, as shown in FIGS. 2a, 2b, and 2c, the microprocessor unit 220 will be triggered by the comparison and amplification unit 210 as the latter has seen an abnormal resistance from the loop (the loop is open-circuited). The microprocessor unit 220, as it has already picked up an absence signal from the personnel detection unit 240, will not initiate the alarm unit 230 to issue alarms. However, once the personnel detection unit 240 has sensed the presence of the operator, the microprocessor unit 220 automatically begins to activate the alarm unit 230 in accordance with the result of the comparison and amplification unit 210 so that the operator will be reminded to wear or re-plug the wrist strap 30. In other words, the absence signal from the personnel detection unit 240 functions like an inhibitor to prevent the microprocessor unit 220 from activating the alarm unit 230 whereas the presence signal functions like an enabler to the microprocessor unit 220. Please note that the personnel detection unit 240 only provides the detection result regarding whether the operator is present or absent. The decision about whether to activate the alarm unit 230 is still carried out by the microprocessor unit 220. To prevent erroneous judgment and to allow the operator some time to settle, the microprocessor unit 220 will remain inhibited after receiving the presence signal for a period of time (e.g., 5 seconds) and, if there is no absence signal within this period of time, the microprocessor unit 220 will then activate the alarm unit 230 in accordance with the result of the comparison and amplification unit 210. In contrast, if an absence signal is received at any point of time, the microprocessor unit will stop activating the alarm unit 230 immediately.

Figure 3B:
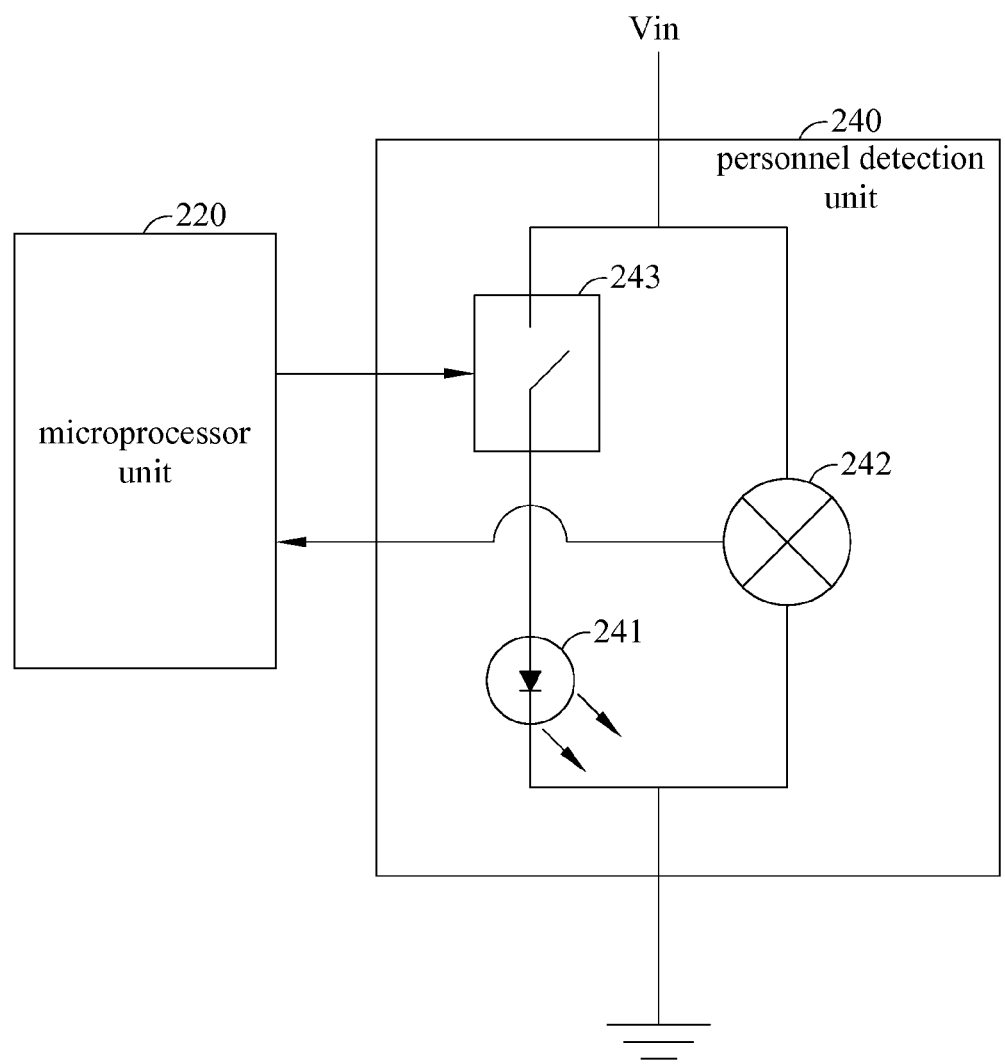
FIG. 3b is a schematic diagram showing an active-typed personnel detection unit of a monitoring device of the present invention.

The personnel detection unit 240 can employ either an active means or a passive means in detecting the presence of an operator. FIG. 3b is a schematic diagram showing an active-typed personnel detection unit of a grounding monitoring device of the present invention. As illustrated, the active-typed personnel detection unit 240 has a wireless energy transmitter, such as the infrared LED 241 in the drawing or radar, which can radiate an electromagnetic or supersonic wave covering a limited range to a front side of the device 100 (i.e., towards the operator). The active-typed personnel detection unit 240 also requires a sensor to detect the energy reflected from the operator, such as the infrared receiver 242 in the drawing. This active-typed detection technique has been widely applied in various fields and there are many different transmitters, sensors, and related circuits disclosed and commercially available. To give a few examples, active-typed detection based on infrared is commonly found on auto-flush toilets, those based on supersonic waves are commonly found on automobile radar backup alarm systems. As illustrated, an output terminal of the microprocessor unit 220 controls an electronic switch 243 to turn on or off the infrared LED 241. On the other hand, the output of the infrared receiver 242 is delivered to an input terminal of the microprocessor unit 242.

Figure 3C:
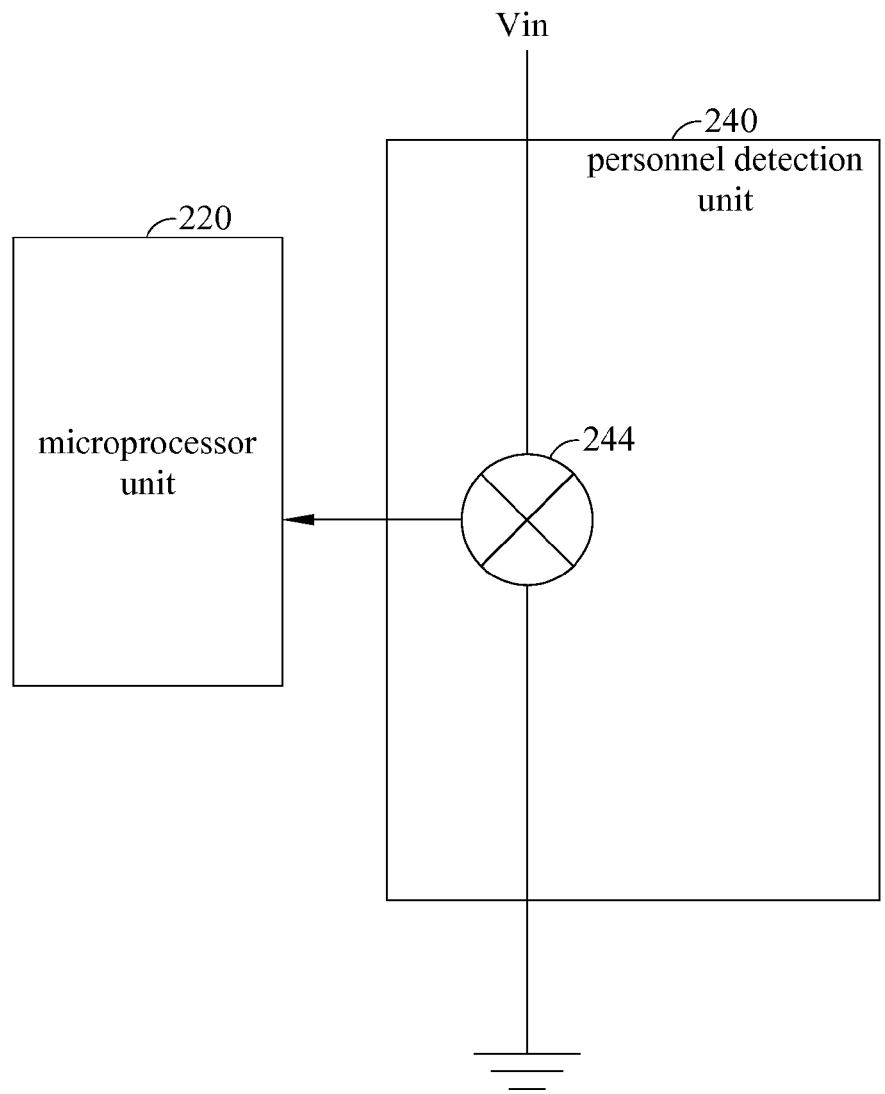
FIG. 3c is a schematic diagram showing a passive-typed personnel detection unit of a monitoring device of the present invention.

The active-typed detection is a rather effective solution to the present invention. However, there are usually chairs also positioned in front of the work stations. The personnel detection unit 240 couldn't distinguish whether it is the operator or the chair (after the operator has left) that is present in front of the work station. The passive-typed detection would provide a more accurate result in this respect. Currently the most common passive-typed detection is based of passive infrared (PIR) sensors, which are able to pick up the movement of a warm object within a specific range. PIR sensors are quite common in security-related applications. However, their adoption has declined in recent years as they cannot distinguish the movement made by a dog or a cat from the movement made by a human being, which are all warm bodies. Interestingly, PIR sensors are quite adequate for the present invention as they have no problem in differentiating the warm human body and the cold chair. As shown in FIG. 3c, the passive-typed personnel detection unit 240 requires a single PIR sensor 244, which is even simpler structurally.

There is another passive-typed detection technique which uses a camera to capture images and performs image analysis to detect object movement. In security surveillance arena, such motion detection technique has already been proven to have a significant accuracy. However, to equip a camera in the personnel detection unit 240 and to make the microprocessor unit 220 powerful enough to carry out image processing would make the device 100 much more complicated and costly.

Figure 3D:
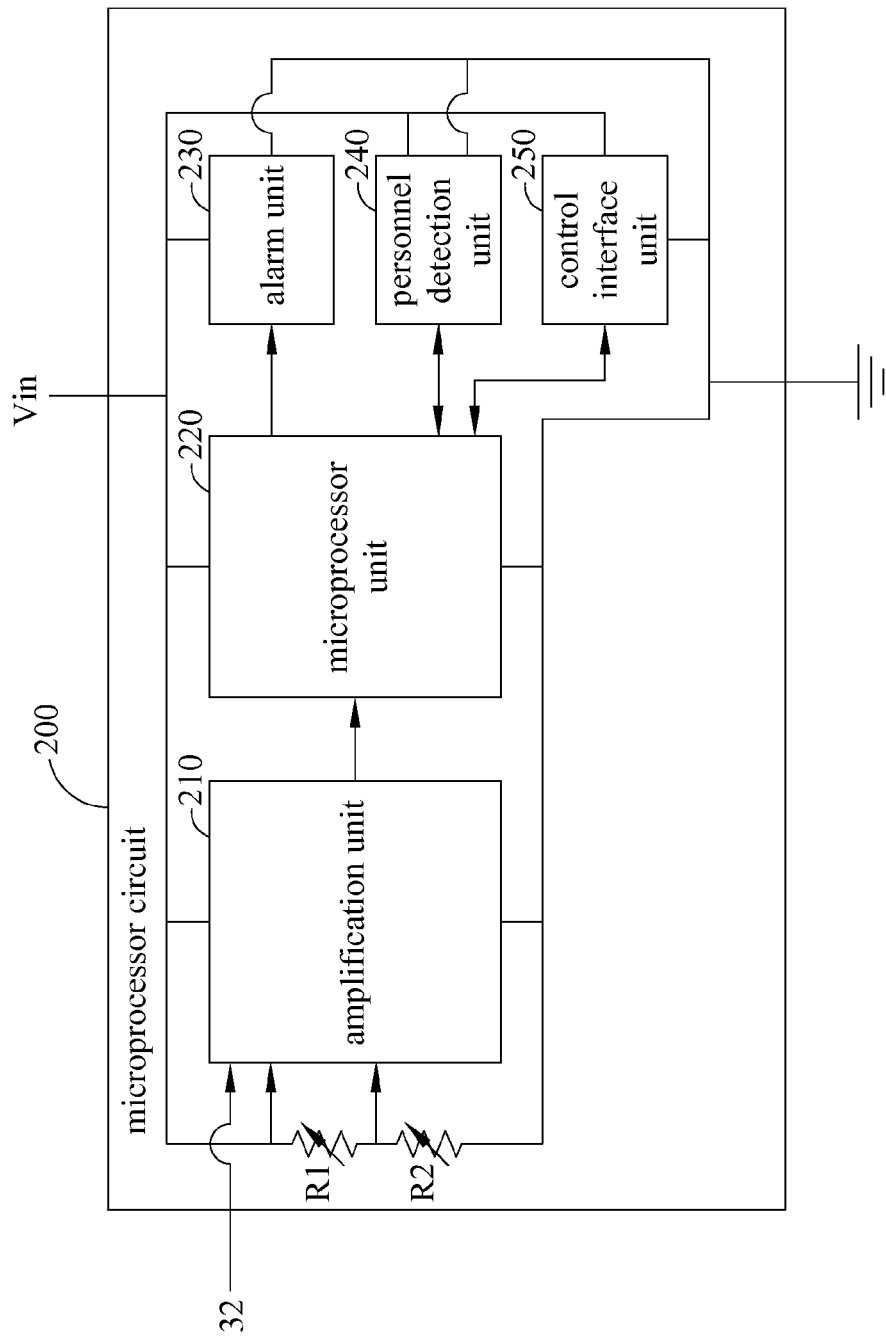
FIG. 3d is a functional block diagram showing a monitoring device's microprocessor circuit according to another embodiment of the present invention.

FIG. 3d is a functional block diagram showing a grounding monitoring device's microprocessor circuit according to another embodiment of the present invention. In the present embodiment, the microprocessor circuit 200 contains an additional control interface unit 250, which provide a human-machine interface to the device 100. The control interface unit 250 signally connects one or more buttons (not shown) forming a control panel on the casing of the device 100. The control interface unit 250 in turn connects a number of input terminals of the microprocessor unit 220 for configuring some operation parameters of the microprocessor unit 220, such as the lead time after receiving a presence signal, turning on and off the detection function of the device 100, turning on and off the alarms, etc. The control interface unit 250 can further connect a small-scale liquid crystal display (LCD) panel for showing the current status of the device 100, for examining the parameter values, etc. The control interface unit 250 could also display alarm messages on the LCD panel.

Figure 4A:
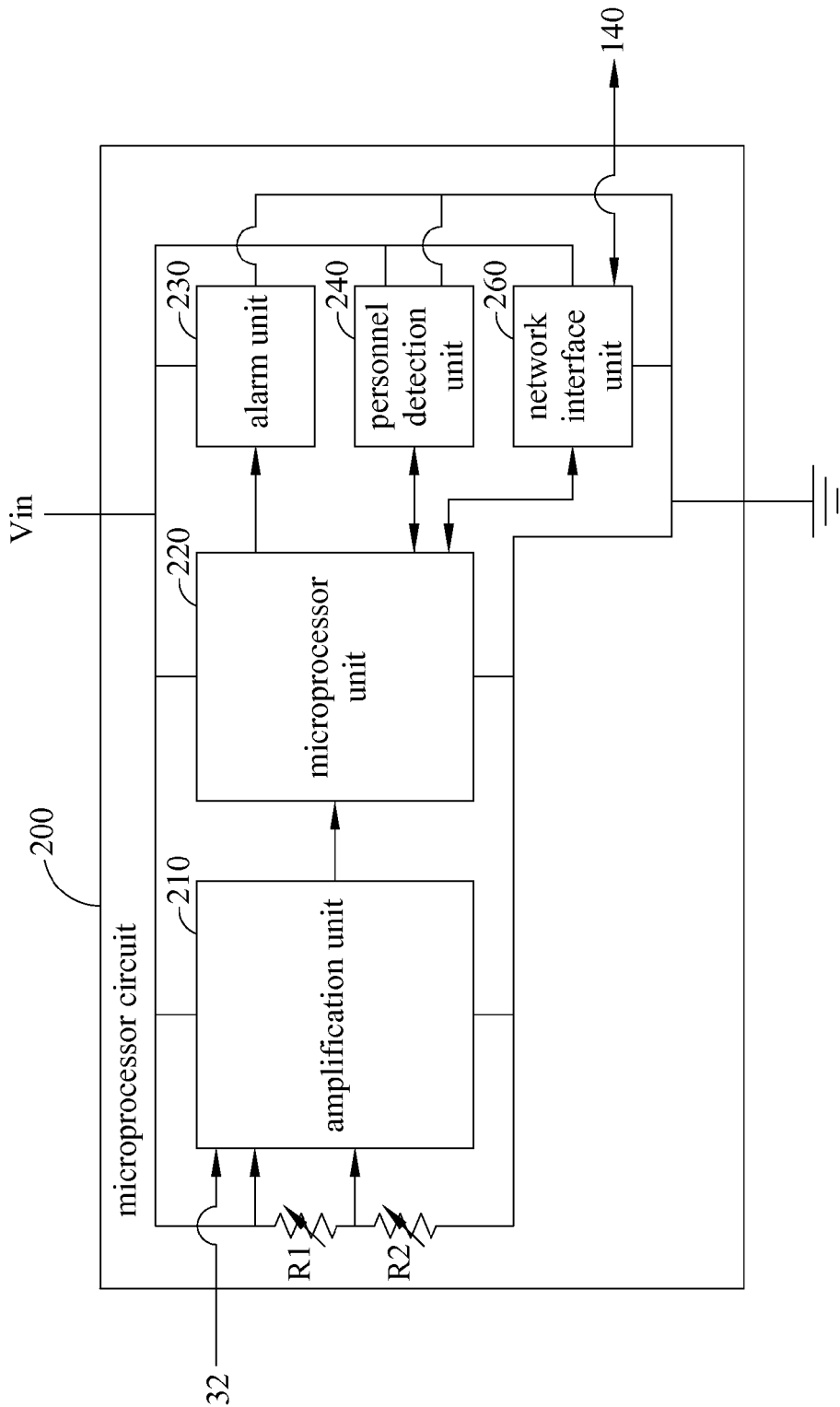
FIG. 4a is a functional block diagram showing a monitoring device's microprocessor circuit according to yet another embodiment of the present invention.
Figure 4B:
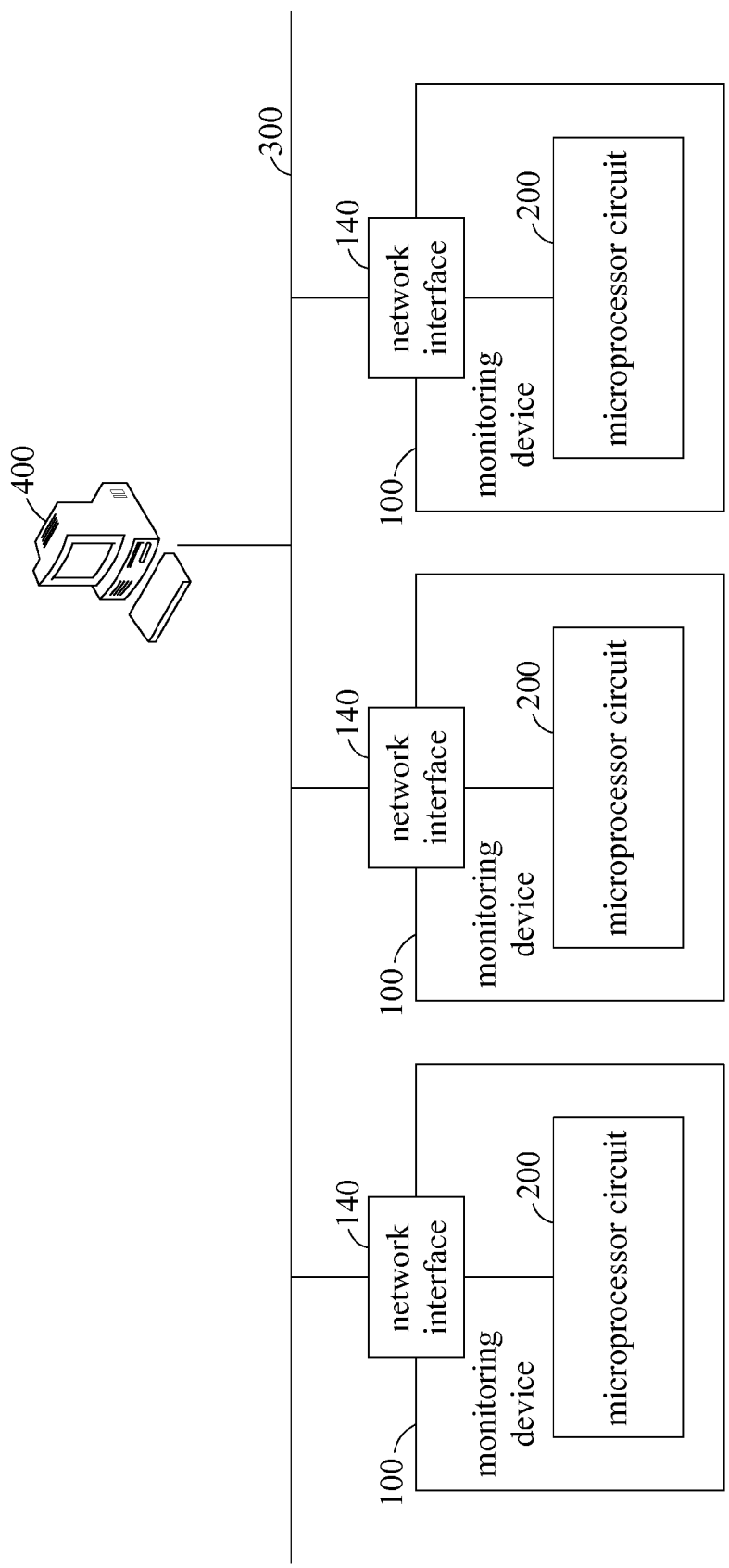
FIG. 4b is a schematic diagram showing multiple monitoring devices of FIG. 4a networked together with a centralized console.

As a typical manufacturing environment contains multiple assembly lines and each assembly line contains multiple work stations, it could be rather time consuming and laborious to configure and monitor the device 100 at each work station. Therefore, FIG. 4a shows another embodiment of the microprocessor circuit 200, which contains an addition network interface unit 260. The network interface unit 260 connects a network interface 140 of the device 100 and the input and output terminals of the microprocessor unit 220 for two-way data exchange. The network interface 140 provides the physical connection to an external network 300, which could be a wired local area network conforming to the 802.11x specifications, or a control network conforming to the RS-485, Lonworks, etc. specifications, to name just a few. Depending on the requirement of the network 300, the network interface 140 should have a compatible physical connection means (such as an RJ-45 socket for hooking onto a local area network). Then, as shown in FIG. 4b, the devices 100 at different work stations can be remotely monitored by a centralized console 400 through the network 300. Therefore, when the microprocessor unit 220 is triggered due to an abnormal resistance found on the loop, the microprocessor unit 220 not only activates the alarm unit 230 to issue visual or audio alarms, but also sends a message via the network interface unit 260 and the network 300 to the console 400. In alternative embodiments, the console 400 could periodically poll and communicate with the microprocessor unit 220 of each device 100 to obtain the status (e.g., whether an abnormal condition in the discharge circuit is detected) thereof. The console 400 could also configure the parameters, turn on and off the detection function, etc. of all devices 100 simultaneously, or of a specific device 100 individually.

Please note that what is shown in FIG. 4b is a wired network in a bus architecture. It should be readily understandable that the present invention is applicable to networks of different architectures such those involve network switches and hubs. To extend even further, the network interface unit 260 could contain a wireless transceiver and the network 300 is a wireless local area network conforming to the 802.11a/b/g standard. In other words, the present invention does not pose specific requirement on whether the network 300 is wired, wireless, or adopting a specific protocol.

Figure 4C:
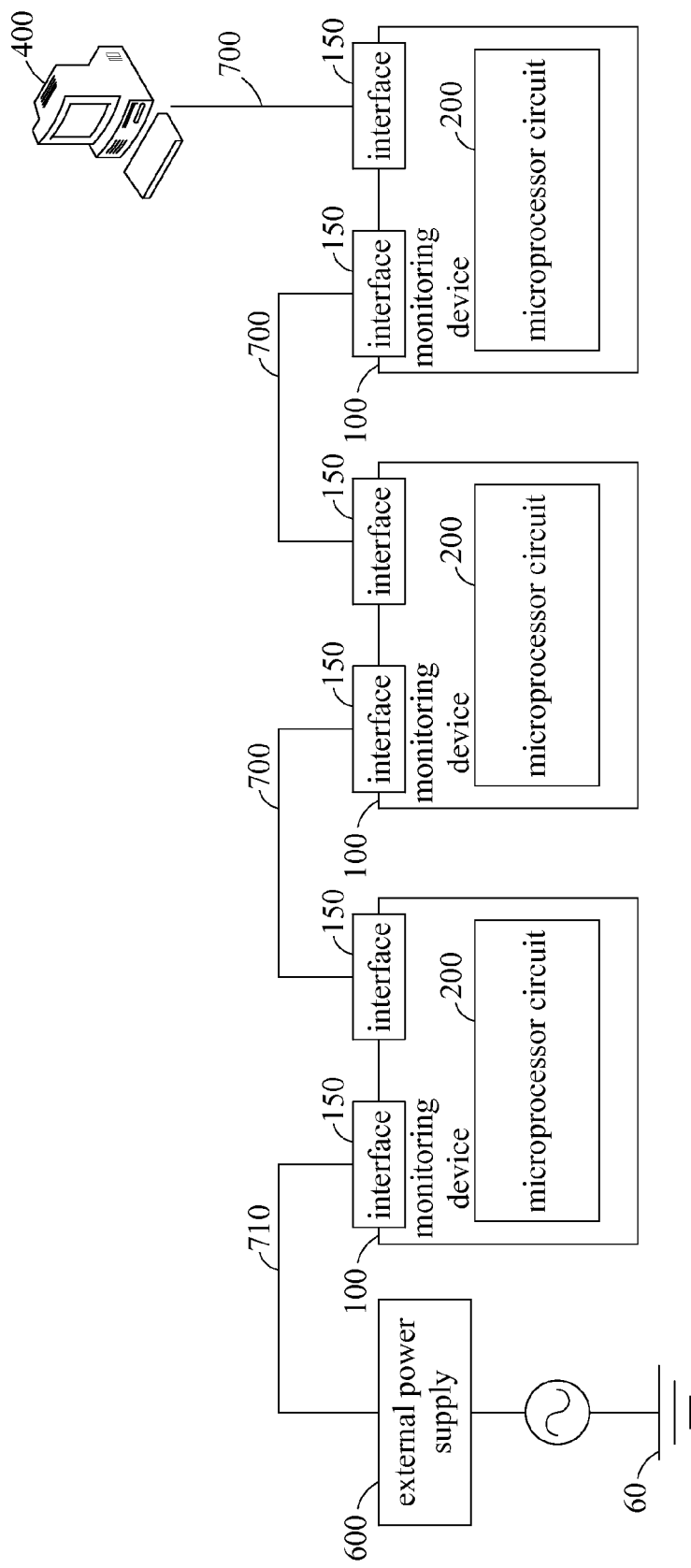
FIG. 4c is a schematic diagram showing multiple monitoring devices cascaded to a centralized console.
Figure 4D:
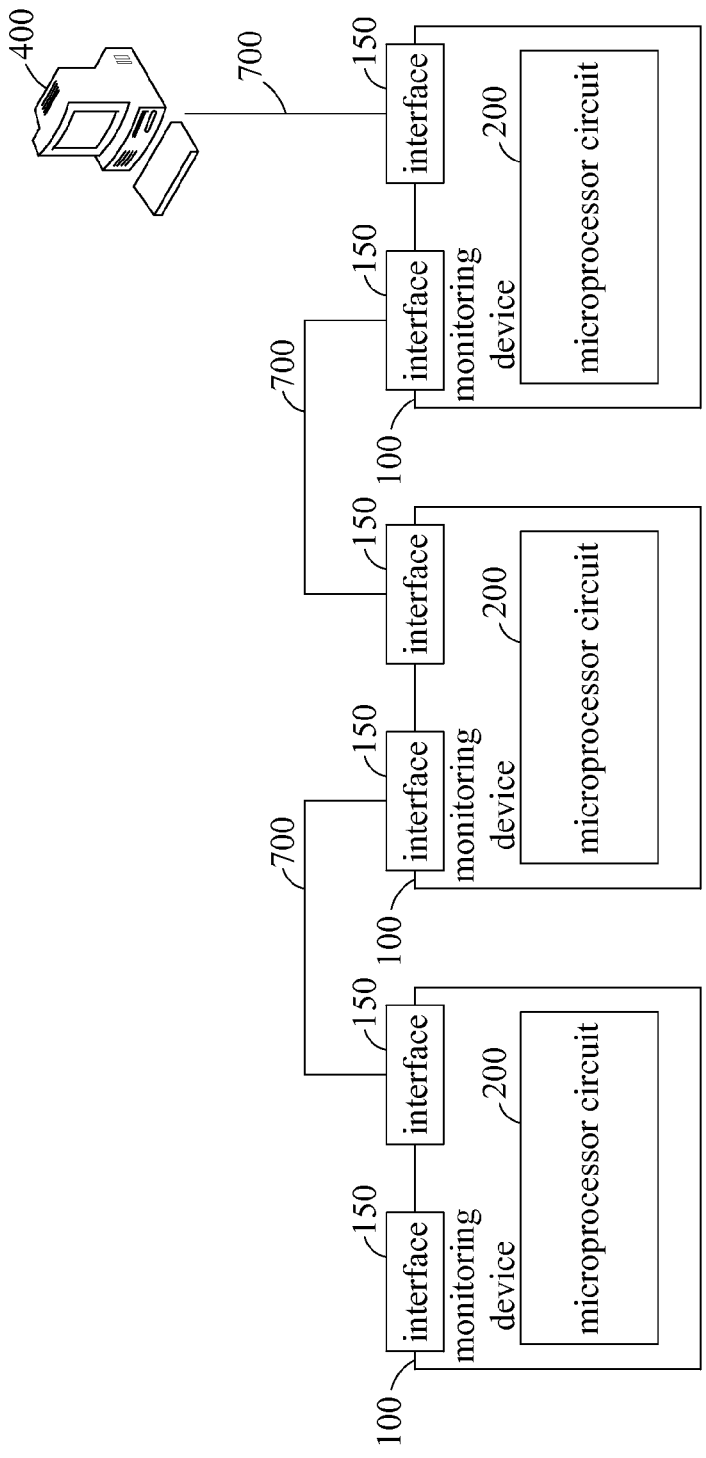
FIG. 4d is a schematic diagram showing multiple monitoring devices cascaded to a centralized console that also provides electricity.

In FIG. 4b, the network interface 140 for connection to the network 300 and the interface 150 for sharing ground and electricity are implemented separately. As shown in FIG. 4c which depicts another embodiment of the present invention, the network interface 140 could actually be integrated into the interface 150, and the cable 700 not only carries the ground and electricity, but also provides two-way data exchange. For example, the interface 150 could be an RJ-45 socket having eight terminals and the cable 700 is an eight-wire twisted-pair cable. Among the eight terminals and wires, four could be used for data transmission and two of the remaining four are for ground and electricity. The details should be rather straightforward for a person skilled in network cabling and therefore are omitted here. Please note that, in the above example, since separate wires and terminals are employed, the cable 700 and the cable 710 for connection to the external power supply could actually be implemented using same kind of cable. In the embodiment shown in FIG. 4d, the external power supply 60 is further omitted and the console 400 now is also responsible for the provision of electricity (i.e., the external power supply 60 and the console 400 are integrated together into a single device). Please note that, in FIGS. 4b to 4d, each device 100 is still connected to the earth ground 50 but these connections are not drawn for simplicity.

As mentioned earlier, each device 100's two interfaces 150 could be used interchangeably; there is no requirement which one should be connected to a previous device 100 or a successive one along the chain. However, in the embodiment shown in FIG. 4c, usually one interface 150 is specified for connection to the previous device 100 (e.g., one farther away from the console 400) and the other interface 150 is specified for connection to the successive device 100 (e.g., one closer to the console 400). The purpose of having such a sequential ordering is that, when the console 400 has learned that one device 100 is detecting abnormal condition, the console 400 is able to locate the specific device 100 through the foregoing sequential ordering of the devices 100. This would be very convenient for maintaining and managing the system of FIG. 4c. For those who are familiar with such daisy-chain configuration, the implementation details should be quite straightforward.

Despite that wrist straps are the most common ground mechanism, and that the proper wearing of the wrist strap has been described so far as the main detection target of the grounding monitoring device, it has to be pointed out that the spirit of the present invention is not limited to the wrist strap only. The present invention could actually be applied to any grounding mechanism that employs two conducting wires to contact two separate spots of the human body to discharge the static electricity. Additionally, the present invention could further be applied to the monitoring of grounding mechanisms using a single conducting wire. This is another major characteristic differentiating the present invention from the previous application.

Figure 5A:
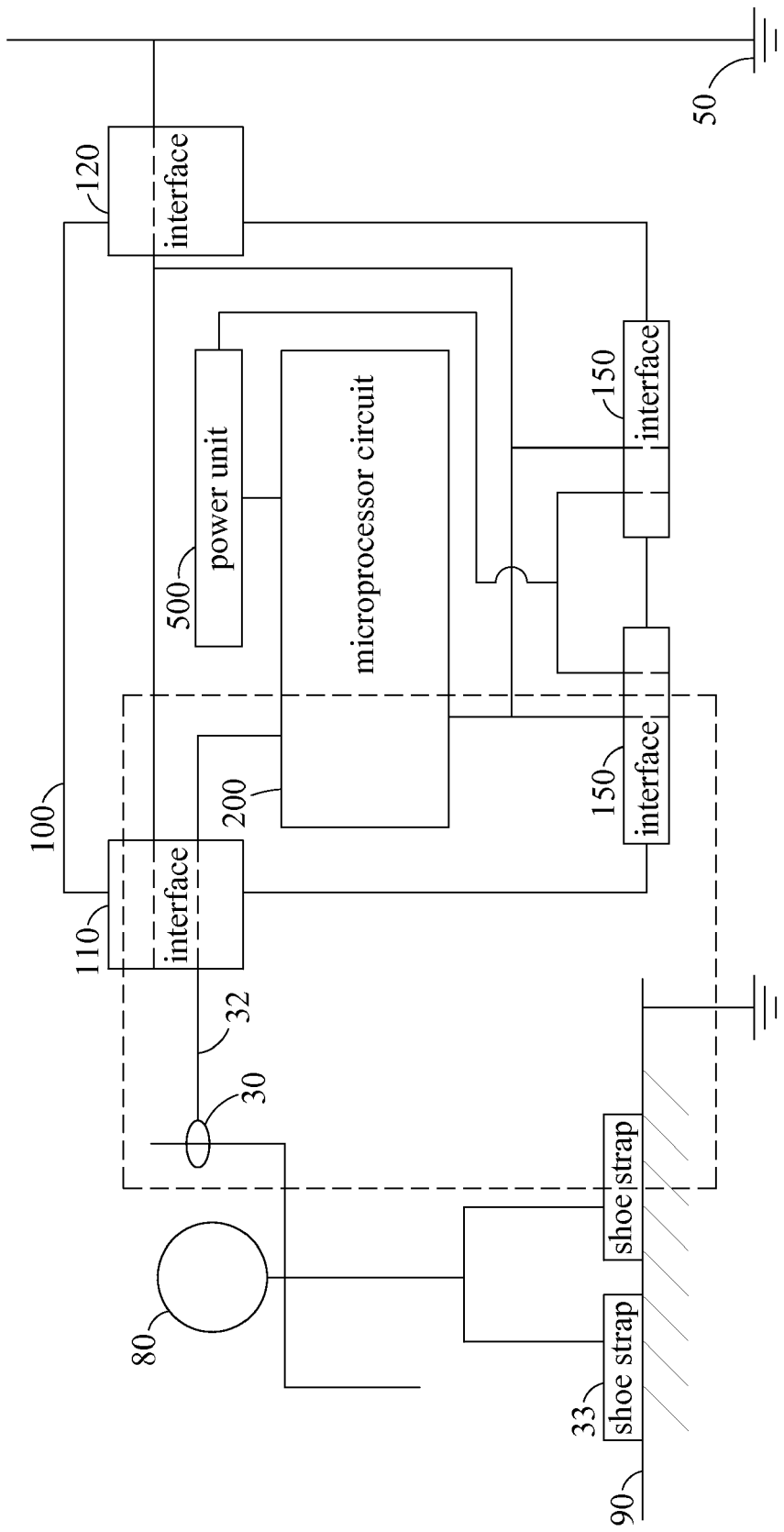
FIG. 5a is a schematic diagram showing the monitoring device of FIG. 2a monitoring a single-wire wrist strap.
Figure 5B:
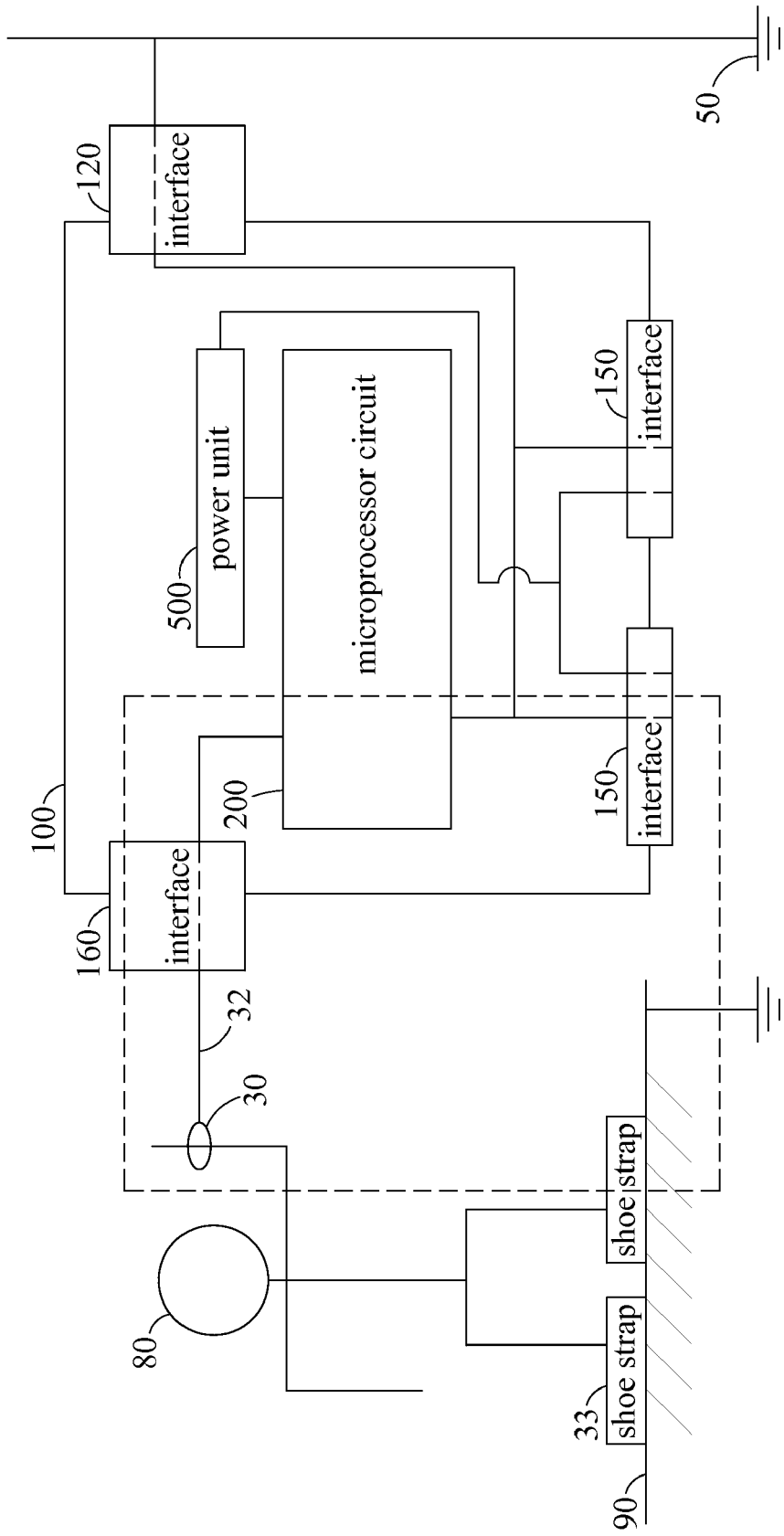
FIG. 5b is a schematic diagram showing a monitoring device according to a fourth embodiment of the present invention.

As shown in FIG. 5a, a single-wire wrist strap 30 is usually used along with a grounded and conductive floor 90. The operator 80 wearing the wrist strap 30 usually also wears a shoe strap 33 to facilitate the static discharge. The device 100 of the present embodiment is basically identical to the monitoring device for two-wire grounding mechanisms. However, an appropriate plug or connector is required so as to connect the single conducting wire 32 of the wrist strap 30 to an appropriate terminal of the interface 110. FIG. 5b depicts another embodiment where an interface 160 specifically for connection to a single-wire grounding mechanism is adopted. By comparing FIGS. 5a and 5b, the interface 160 also lacks the internal connection to the interface 120.

As denoted by the dashed lines of FIGS. 5a and 5b, the loop monitored by the device 100 is constituted by the wire 32, the wrist strap 30, the body of the operator 80, the conductive floor 90, the earth, and the microprocessor circuit 200. In other words, the device 100 monitors the resistance seen between the wire 32 and the interface 120. Therefore, unlike the monitoring of a two-wire grounding mechanism where the loop is completed within the device, the monitoring of a single-wire grounding mechanism, the loop actually runs through the earth. Other than the foregoing differences, the devices 100 for two-wire grounding mechanisms and for single-wire grounding mechanisms could be completely identical. Please note that the backup grounding, the way the static electricity discharges, monitoring additional grounding mechanisms by series or parallel connection, networking multiple monitoring devices, wireless detection of the presence of the operator, etc., as detailed earlier could all be applied to the devices 100 of FIGS. 5a and 5b as well. Furthermore, a single device 100 could connect and monitor both single-wire and two-wire grounding mechanisms simultaneously. These variations should be easy to extend from the aforementioned embodiments.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A device for monitoring at least a grounding mechanism for an operator at a work station, said device comprising:
    two cascading interfaces, each having at least a first terminal and a second terminal, said first terminals of said cascading interfaces being connected together, said second terminals of said cascading interfaces being connected together;
    a power unit electrically connected to said first terminals of said cascading interfaces, said power unit extracting electricity from said first terminals and producing at least an appropriate direct-current voltage;
    a first interface having at least a first terminal;
    a second interface having at least a first terminal connected to said second terminals of said cascading interfaces; and
    a microprocessor circuit driven by said direct-current voltage and connected to said first terminal of said first interface and said first terminal of said second interface, said microprocessor circuit having at least a comparison and amplification unit, a personnel detection unit, and a microprocessor unit;
    wherein said comparison and amplification unit measures a resistance between said first terminal of said first interface and said first terminal of said second interface, and compares said resistance with a first reference resistance; when said resistance measured is larger than said first reference resistance, said comparison and amplification unit produces an abnormal signal; said personnel detection unit having a wireless energy detection mechanism capable of sensing the presence and absence of an operator in a coverage area and producing corresponding triggering signals respectively; said microprocessor unit activates at least one of an audio alarm and a visual alarm after receiving said abnormal signal only when said microprocessor unit has received a triggering signal specifying the presence of an operator in said coverage area and has not received a triggering signal specifying the absence of an operator in said coverage area for a period of time.

2. The device according to claim 1, wherein said second interface is connected to an earth ground.

3. The device according to claim 1, wherein one of said cascading interfaces is connected to a power supply via a first cable; said power supply is connected to a mains; said power supply provides electricity to said first terminals of said cascading interfaces; and said power supply provides a mains ground to said second terminals of said cascading interfaces.

4. The device according to claim 1, wherein said first terminal of said first interface is connected to a single-wire wrist strap.

5. The device according to claim 1, wherein said first interface further has a second terminal.

6. The device according to claim 5, wherein said second terminal of said first interface is connected to said first terminal of said second interface; and said first and second terminals of said first interface are connected to a first conducting wire and a second conducting wire of a two-wire wrist strap, respectively.

7. The device according to claim 5, further comprising a third interface, wherein said third interface has a first terminal and a second terminal; said second terminal of said first interface is connected to said first terminal of said third interface; and said second terminal of said third interface is connected to said first terminal of said second interface.

8. The device according to claim 7, wherein said first and second terminals of said first interface are connected to a first conducting wire and a second conducting wire of a two-wire wrist strap; and said first and second terminals of said third interface are connected to a first conducting wire and a second conducting wire of one of a two-wire floor mat and a two-wire table mat.

9. The device according to claim 1, wherein said comparison and amplification unit further has a second reference resistance; said second reference resistance is less than said first reference resistance; and said comparison and amplification unit produces said abnormal signal when said resistance measured is less than said second reference resistance.

10. The device according to claim 1, wherein said wireless energy detection mechanism comprises an energy transmitter and an energy sensor; said energy transmitter radiates energy towards said coverage area; and said energy sensor detects energy being reflected.

11. The device according to claim 1, wherein said wireless energy detection mechanism comprises a passive infrared sensor.

12. The device according to claim 1, further comprising a control interface unit as a man-machine interface to said device by providing input and output to said microprocessor unit through two-way data exchange between said control interface unit and said microprocessor unit.

13. The device according to claim 1, further comprising a network interface unit and a network interface; said network interface unit has two-way data exchange with said microprocessor unit and said network interface; and said network interface unit is connected to a network via said network interface.

14. The device according to claim 13, wherein said microprocessor unit produces an alarm signal after receiving said abnormal signal from said comparison and amplification unit only when said microprocessor unit has received a triggering signal specifying the presence of an operator in said coverage area and has not received a triggering signal specifying the absence of an operator in said coverage area for a period of time; and said microprocessor unit delivers said alarm signal to a console connected to said network via said network interface unit and said network.

15. A system for monitoring at least a grounding mechanism for an operator at a work station, said system comprising:
- a plurality of second cables, each having at least a first conducting wire and a second conducting wire;
- a plurality of devices according to claim 1, each device having at least one of said cascading interfaces connected to one of said cascading interfaces of another device via a second cable, said first conducting wire of said second cable connected to said first terminals of said cascading interfaces of said devices, and said second conducting wire of said second cable connected to said second terminals of said cascading interfaces of said devices; and
- a power supply connected to a mains, said power supply connected to one of said cascading interfaces of one of said devices via a first cable, said power supply providing electricity to said first terminal of said cascading interface and a mains ground to said second terminal of said cascading interface;
- wherein said mains ground and said electricity are delivered to said devices through said second cables cascading said devices.

16. The system according to claim 15, wherein at least one of said devices has said second interface connected to an earth ground.

17. The system according to claim 15, wherein said cascading interfaces conform to RJ-45 standard; and said second cables are twisted-pair cables.

18. The system according to claim 15, wherein said second cables and said first cable are identical cables.

19. The system according to claim 15, further comprising a console; wherein each device further has a network interface unit and a network interface; said console and said devices are connected into a network; said network interface unit has two-way data exchange with said microprocessor unit and said network interface; said network interface unit is connected to said network via said network interface; said microprocessor unit produces an alarm signal after receiving said abnormal signal from said comparison and amplification unit only when said microprocessor unit has received a triggering signal specifying the presence of an operator in said coverage area and has not received a triggering signal specifying the absence of an operator in said coverage area for a period of time; and said microprocessor unit delivers said alarm signal to said console via said network interface unit and said network.

20. The system according to claim 19, wherein said network is a wireless network.

21. The system according to claim 19, wherein said network interface is integrated into said cascading interfaces; each cascading interface further has a plurality of third terminals; said third terminals of said cascading interfaces of each device are connected together, respectively; each second cable further has a plurality of third conducting wires corresponding to said third terminals of each cascading interface; said network interface unit and said third terminals have two-way data exchange; and said console is connected to one of said cascading interface of one of said devices by a second cable.

22. The system according to claim 21, wherein said power supply and said console are integrated into a single apparatus.

23. The system according to claim 21, wherein each device has one of said cascading interfaces dedicated to the connection with a previous device and has the other cascading interface dedicated to the connection with a successive device.

* * * * *